(12) United States Patent
Tanaka

(10) Patent No.: US 8,125,783 B2
(45) Date of Patent: Feb. 28, 2012

(54) PRINTED CIRCUIT BOARD AND ELECTRONIC APPARATUS

(75) Inventor: Makoto Tanaka, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/560,243

(22) Filed: Sep. 15, 2009

(65) Prior Publication Data

US 2010/0002388 A1 Jan. 7, 2010

Related U.S. Application Data

(63) Continuation of application No. 12/042,182, filed on Mar. 4, 2008, now Pat. No. 7,639,503.

(30) Foreign Application Priority Data

Mar. 29, 2007 (JP) .................. 2007-088831

(51) Int. Cl.
*H05K 7/20* (2006.01)
(52) U.S. Cl. ........ 361/720; 361/719; 257/720; 257/727; 174/260
(58) Field of Classification Search .................. 361/695, 361/700, 702, 711, 719, 707, 709, 710, 717, 361/720, 721
See application file for complete search history.

(56) References Cited

U.S. PATENT DOCUMENTS 5,543,663 A * 8/1996 Takubo .................. 257/720
(Continued)

FOREIGN PATENT DOCUMENTS

CN 2864795 1/2007
(Continued)

OTHER PUBLICATIONS

United States Office Action dated Oct. 1, 2008 for U.S. Appl. No. 12/042,182, filed Mar. 4, 2008.
(Continued)

*Primary Examiner* — Courtney Smith
(74) *Attorney, Agent, or Firm* — Blakely, Sokoloff, Taylor & Zafman LLP

(57) ABSTRACT

According to one embodiment, a printed circuit board comprises a printed wiring board, circuit component, reinforcing plate and first and second fixing portion. The printed wiring board includes first and second areas. A reinforcing plate secured to the other of the first and second surfaces in said at least one of the first and second areas. The first fixing portion is provided on a border line that defines the first and second areas. The first fixing portion can fix the reinforcing plate to both the first and second areas. The second fixing portion comprises a plurality of apertures arranged symmetrical with respect to the border line.

25 Claims, 8 Drawing Sheets

U.S. PATENT DOCUMENTS

| | | | | |
|---|---|---|---|---|
| 5,777,844 A * | 7/1998 | Kiefer | | 361/704 |
| 6,469,893 B1 | 10/2002 | Frutschy et al. | | |
| 6,535,386 B2 * | 3/2003 | Sathe et al. | | 361/700 |
| 6,594,149 B2 * | 7/2003 | Yamada et al. | | 361/699 |
| 6,611,431 B1 | 8/2003 | Lee et al. | | |
| 6,865,082 B2 * | 3/2005 | Huang et al. | | 361/700 |
| 7,170,750 B2 * | 1/2007 | Tanaka | | 361/719 |
| 7,310,227 B2 * | 12/2007 | Kusamoto et al. | | 361/695 |
| 7,327,574 B2 | 2/2008 | Frank et al. | | |
| 7,352,581 B2 * | 4/2008 | Tomioka | | 361/702 |
| 7,397,667 B2 | 7/2008 | Lin et al. | | |
| 7,414,850 B2 | 8/2008 | Hung | | |
| 7,426,112 B2 | 9/2008 | Chi-Wei et al. | | |
| 7,489,510 B1 * | 2/2009 | Hung et al. | | 361/700 |
| 7,639,503 B2 | 12/2009 | Tanaka | | |
| 2004/0001316 A1 | 1/2004 | Kamikawa et al. | | |
| 2004/0118584 A1 * | 6/2004 | Franz et al. | | 174/52.1 |
| 2004/0123978 A1 | 7/2004 | Hashimoto et al. | | |
| 2004/0201958 A1 | 10/2004 | Lev | | |
| 2004/0264114 A1 | 12/2004 | Hachiya | | |
| 2005/0117307 A1 | 6/2005 | Tanaka | | |
| 2006/0139902 A1 * | 6/2006 | Happoya | | 361/760 |
| 2006/0169488 A1 | 8/2006 | Kaji | | |
| 2007/0063324 A1 | 3/2007 | Mishiro et al. | | |
| 2007/0236887 A1 | 10/2007 | Cheng et al. | | |
| 2008/0130240 A1 * | 6/2008 | Wang et al. | | 361/719 |
| 2008/0202740 A1 | 8/2008 | Hung et al. | | |
| 2008/0216997 A1 * | 9/2008 | Wang et al. | | 165/185 |

FOREIGN PATENT DOCUMENTS

| | | |
|---|---|---|
| JP | 53-036465 | 4/1978 |
| JP | 3-011797 | 1/1991 |
| JP | H062780 | 1/1994 |
| JP | 3-083952 | 2/2002 |
| JP | 2004-039685 | 2/2004 |
| JP | 2004-356492 | 12/2004 |
| JP | 2005-166715 | 6/2005 |
| JP | 2006-202525 | 8/2006 |

OTHER PUBLICATIONS

United States Office Action dated Apr. 30, 2009 for U.S. Appl. No. 12/042,182, filed Mar. 4, 2008.

People's Republic of China Patent Application No. 200810081551X, First Office Action, mailed Jun. 12, 2009 (English Translation).

Japanese Patent Application No. 2007-088831, Notice of Reasons for Rejection, mailed Oct. 11, 2011, (with English Translation).

* cited by examiner

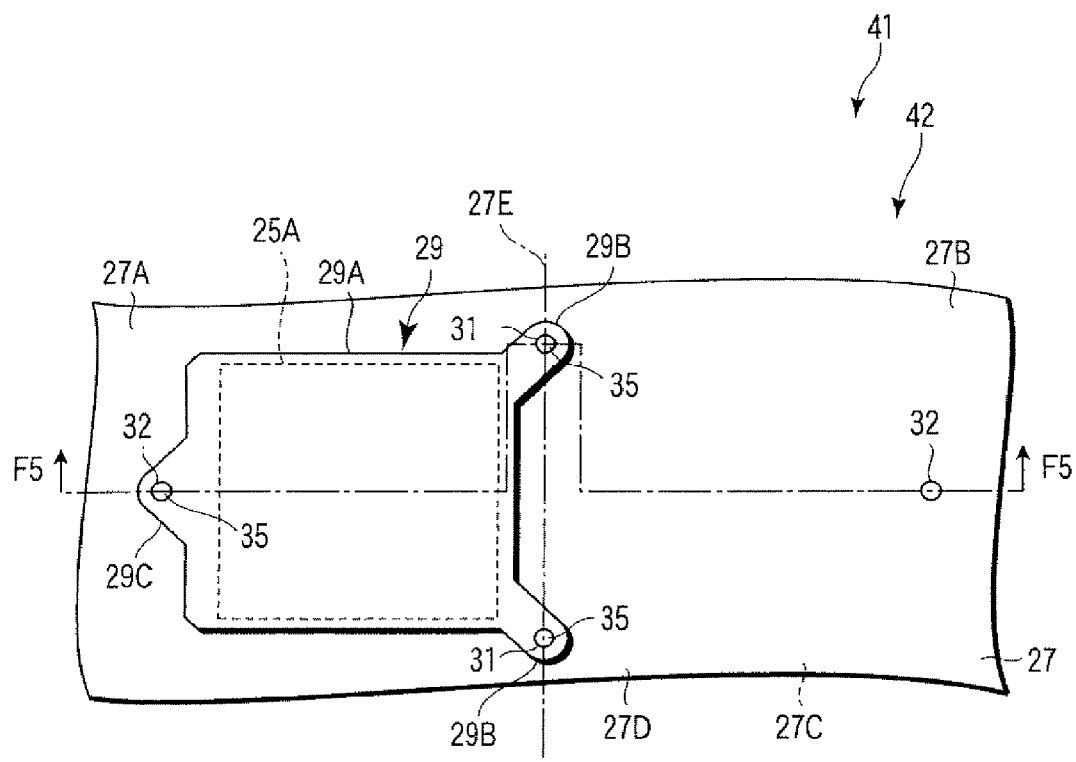
F I G. 4
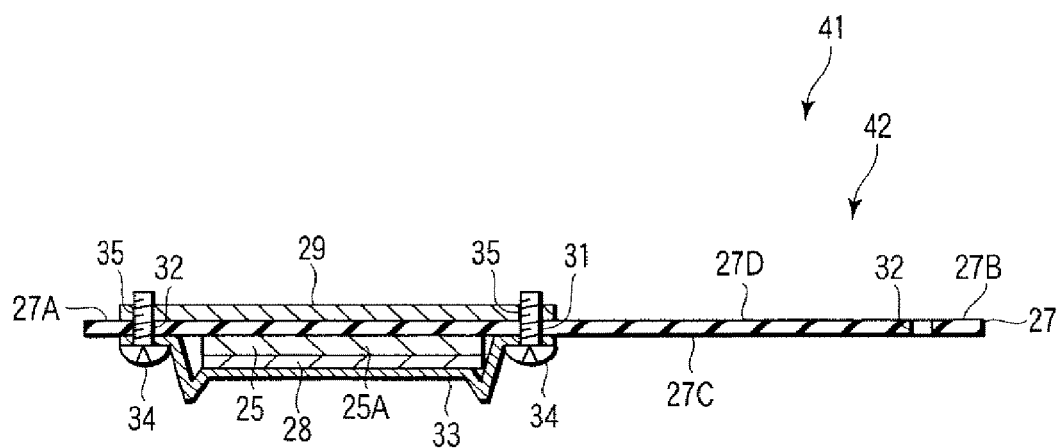
F I G. 5

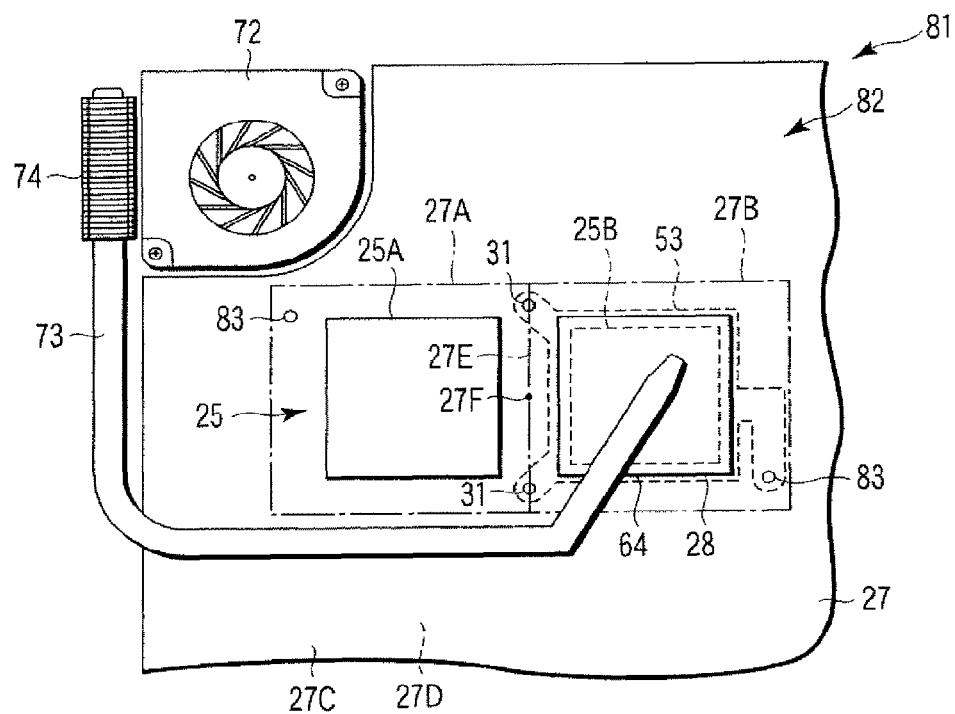
F I G. 12
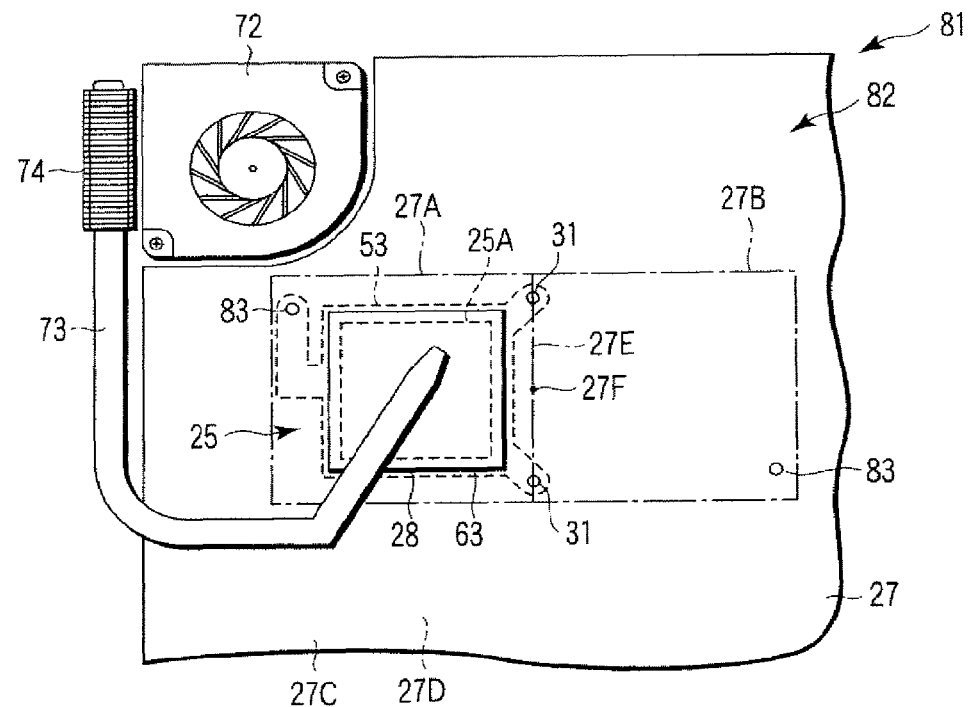
F I G. 13

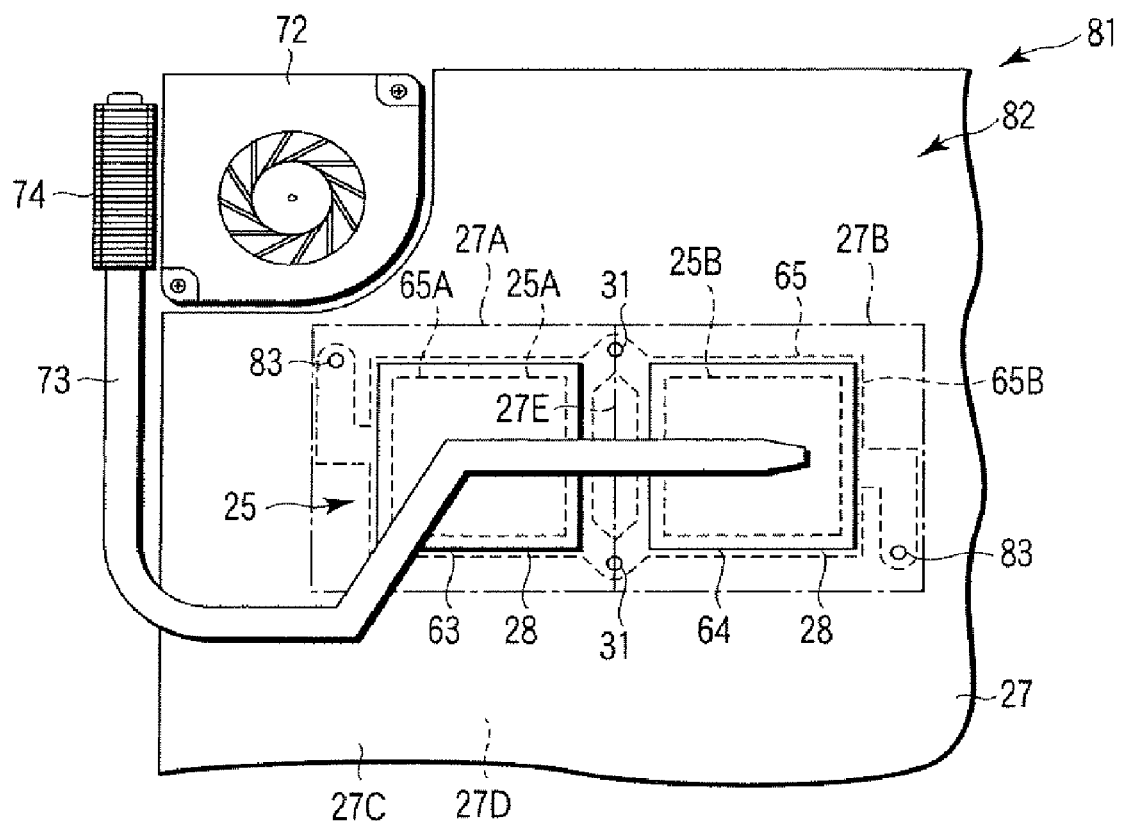
F I G. 14

PRINTED CIRCUIT BOARD AND ELECTRONIC APPARATUS

CROSS-REFERENCE TO RELATED APPLICATIONS

This application is a continuation application of U.S. patent application Ser. No. 12/042,182, filed Mar. 4, 2008, now U.S. Pat. No. 7,639,503, which is based upon and claims the benefit of priority from Japanese Patent Application No. 2007-088831, filed Mar. 29, 2007, the entire contents of which are incorporated herein by reference.

BACKGROUND

1. Field

One embodiment of the invention relates to a printed circuit board with a reinforcing plate for preventing warps, and an electronic apparatus incorporating the printed circuit board.

2. Description of the Related Art

Jpn. Pat. Appln. KOKAI Publication No. 2006-202525, for example, discloses a connection structure in which a connector is attached to a circuit board for vehicle control. This connection structure comprises a printed circuit board and first and second connectors attached to the printed circuit board and having different sizes. The printed circuit board has three screw holes. Two of the three screw holes are used as a pair of first screw holes for screwing the first connector, and two of the three screw holes are used as a pair of second screw holes for screwing the second connector. Namely, one of the three screw holes is used in common to connect the first and second connectors.

In the meantime, reinforcing plates may be employed for a printed circuit board to prevent it from warping. In this case, to screw reinforcing plates of different sizes to the printed circuit board, the above-mentioned structure may be used. Namely, a plurality of screw holes for screwing reinforcing plates of different sizes are formed in the printed circuit board, and parts of the screw holes are used in common. However, even if some screws are used in common, two reinforcing plates of different sizes must be prepared, which inevitably increases the number of components and increases the manufacturing cost.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 4 is an exemplary upper view illustrating part of a printed circuit board incorporated in a portable computer according to a second embodiment;

FIG. 5 is an exemplary sectional view taken along line F5-F5 in FIG. 4;

FIG. 12 is an exemplary upper view illustrating the interior of the housing of a portable computer according to a sixth embodiment;

FIG. 13 is an exemplary upper view illustrating a modification of the portable computer according to the sixth embodiment; and FIG. 14 is an exemplary upper view illustrating the interior of the housing of a portable computer according to a seventh embodiment.

DETAILED DESCRIPTION

Various embodiments according to the invention will be described hereinafter with reference to the accompanying drawings. In general, according to one embodiment of the invention, a printed circuit board comprises a printed wiring board, circuit component, reinforcing plate and first and second fixing portion. The printed wiring board includes first and second areas. The first fixing portion is provided on a border line that defines the first and second areas. The first fixing portion can fix the reinforcing plate to both the first and second areas. The second fixing portion comprises a pair of elements arranged symmetrical with respect to the border line.

Figure 1:
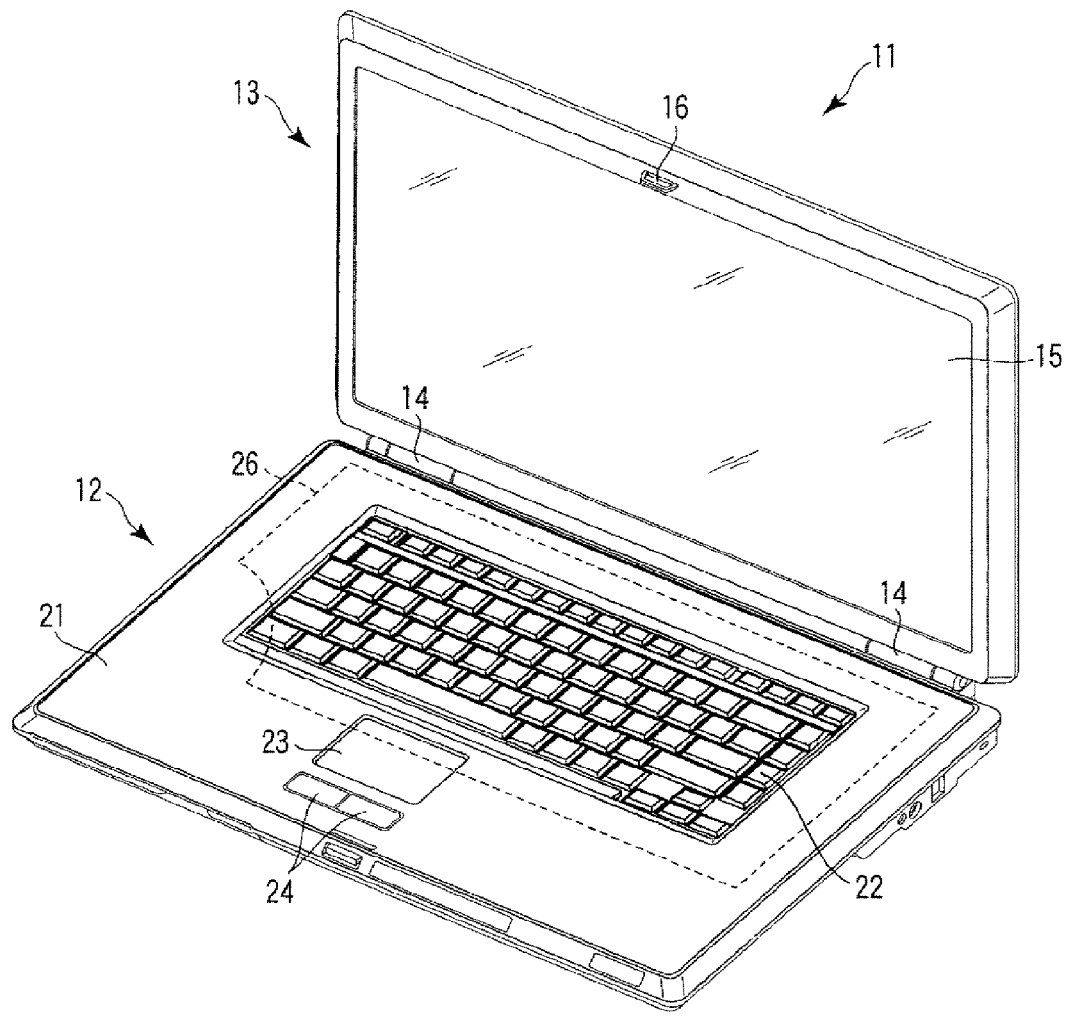
FIG. 1 is an exemplary perspective view illustrating a portable computer according to a first embodiment.
Figure 2:
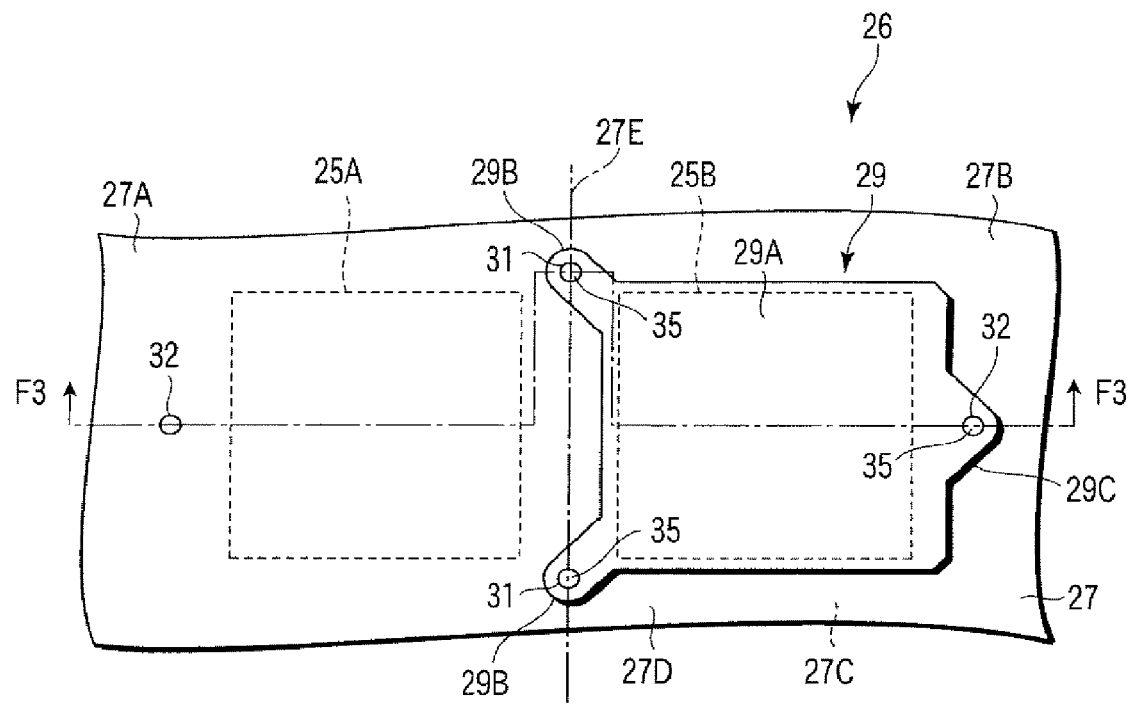
FIG. 2 is an exemplary upper view illustrating part of a printed circuit board received in the housing of the portable computer shown in FIG. 1.
Figure 3:
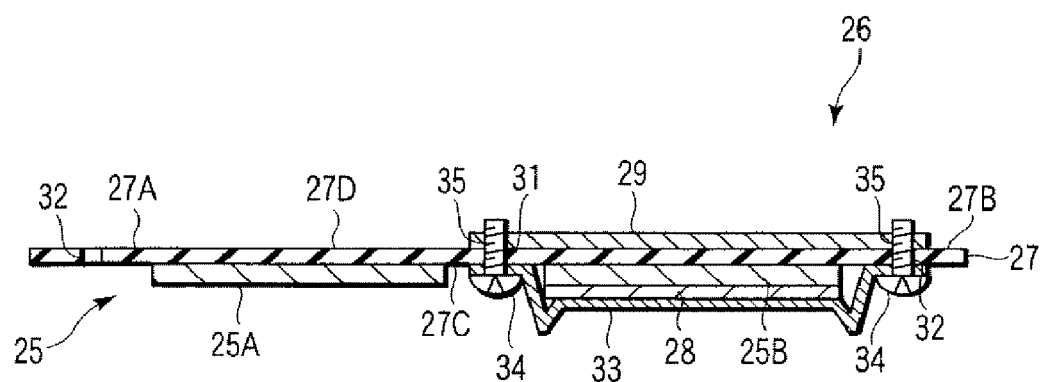
FIG. 3 is an exemplary sectional view taken along line F3-F3 in FIG. 2.

Referring first to FIGS. 1 to 3, a description will be given of an electronic apparatus according to a first embodiment. As shown in FIG. 1, a portable computer 11 as an example of the electronic apparatus comprises a main unit 12, display unit 13, and hinge sections 14 provided therebetween. The hinge sections 14 support the display unit 13 so that the display unit 13 can angularly move or rotate with respect to the main unit 12. The display unit 13 includes a display 15 and latch 16.

The main unit 12 includes a housing 21, keyboard 22, touch pad 23 (pointing device), and button 24. As shown in FIG. 2, the main unit 12 includes a printed circuit board 26 with circuit components 25 mounted thereon, which is housed in the housing 21.

As shown in FIGS. 2 and 3, the printed circuit board 26 comprises a printed wiring board 27 having a first area 27A and second area 27B adjacent thereto, circuit components 25 mounted on the first surface 27C of the printed wiring board 27, a cooling mechanism 28 for cooling the circuit components 25, a reinforcing plate 29 attached to the second surface 27D of the printed wiring board 27 in the area corresponding to one of the circuit components 25, and first and second fixing portion 31 and 32 provided at the printed wiring board 27 to fix the reinforcing plate 29 to the wiring board 27. The cooling mechanism 28 is formed of, for example, a heat-dissipating metal plate and is pressed against the circuit components 25. However, the cooing mechanism 28 is not limited to this member, but may be formed of, for example, a heat sink of a pin support shape. The printed circuit board 26 has a plate spring 33 that presses the cooling mechanism 28 against the circuit components 25. The plate spring 33 and reinforcing plate 29 are fixed to the printed wiring board 26 by screws 34.

The printed wiring board 27 is formed of copper wiring layers stacked on each other. The printed wiring board 27 has the first area 27A located on the left side in FIG. 2, the second area 27B located adjacent thereto on the right side, and a border line 27E defining the first and second areas 27A and 27B.

The circuit components 25 are, for example, a north bridge 25A and graphics chip 25B. The north bridge 25A is fixed to the first area 27A of the printed wiring board 27, and the graphics chip 25B is fixed to the second area 27B of the printed wiring board 27.

The reinforcing plate 29 is fixed to the second area 27B, corresponding to the graphics chip 25B. The reinforcing plate 29 is a so-called electrolytic zinc-coated steel sheet, and prevents the printed circuit board 26 from warping when the cooling mechanism 28 is pressed against one of the circuit components by the plate spring 33, thereby preventing the Ball Grid Array (BGA) of the circuit components 25 from peeling off. The reinforcing plate 29 has a rectangular main body 29A, a pair of arm portions 29B obliquely extending from the main body 29A, and a projection 29C projecting from one side of the main body 29A. The pair of arm portions 29B and projection 29C have screw holes 35. The reinforcing plate 29 is screwed to the printed wiring board 26 by screws 34 inserted through the screw holes 35.

The first fixing portion 31 comprises a pair of elements provided at the printed wiring board 27 on the border line 27E thereof. Specifically, the first fixing portion 31 comprises a pair of screw holes in the printed wiring board 27 on the border line 27E. Similarly, the second fixing portion 32 comprises a pair of elements provided at the printed wiring board 27 symmetrical with respect to the border line 27E. Specifically, the second fixing portion 32 comprises a pair of symmetrical screw holes formed in the printed wiring board 27. The reinforcing plate 29 is secured to the printed wiring board 27 by the first and second fixing portion 31 and 32. In this structure, the heat generated by the graphics chip 25B is dissipated by the dissipation metal plate of the cooling mechanism 28.

Referring then to FIGS. 4 and 5, an electric device according to a second embodiment will be described. A portable computer 41 as an example of the electronic apparatus according to the second embodiment differs from the first embodiment in the arrangement of the circuit component 25 and reinforcing plate 29, and is similar thereto in the other portions. Therefore, in this embodiment, elements similar to those of the first embodiment are denoted by corresponding reference numbers, and a description will be mainly given of different portions.

A printed circuit board 42 according to the second embodiment comprises a printed wiring board 27 having a first area 27A and second area 27B adjacent thereto, a circuit component 25 mounted on the first surface 27C of the printed wiring board 27, a cooling mechanism 28 for cooling the circuit component 25, a reinforcing plate 29 attached to the second surface 27D of the printed wiring board 27 in the area corresponding to the circuit component 25, and first and second fixing portion 31 and 32 provided at the printed wiring board 27 to fix the reinforcing plate 29 to the wiring board 27. The cooling mechanism 28 is formed of, for example, a heat-dissipating metal plate. The printed circuit board 42 has a plate spring 33 that presses the cooling mechanism 28 against the circuit component 25. The plate spring 33 and reinforcing plate 29 are fixed to the printed wiring board 27 by screws 34.

The printed wiring board 27 has a first area 27A, second area 27B adjacent thereto, and a border line 27E defining the first and second areas 27A and 27B. The circuit component 25 is, for example, a north bridge 25A that contains a graphics chip. The north bridge 25A is fixed to the first area 27A of the printed wiring board 27.

The reinforcing plate 29 has the same shape as that employed in the first embodiment, and is fixed to the first area 27A, corresponding to the north bridge 25A. The reinforcing plate 29 is screwed to the printed wiring board 27 by screws 34 inserted through screw holes 35 formed in a pair of arm portions 29B and a projection 29C. The first and second fixing portion 31 and 32 of the printed wiring board 27 have the same structures as the corresponding portion of the first embodiment. The reinforcing plate 29 is secured to the printed wiring board 27 by the first and second fixing portion 31 and 32. In this structure, the heat generated by the north bridge 25A is dissipated by the dissipation metal plate of the cooling mechanism 28.

In the first and second embodiments, the first fixing portion 31 is located on the border line 27E that defines the first and second areas 27A and 27B, and can fix the reinforcing plate 29 regardless of whether the reinforcing plate 29 is attached to the first area 27A or second area 27B. The second fixing portion 32 comprises a pair of elements arranged symmetrical with respect to the border line 27E. The thus-fixed reinforcing plate 29 can prevent the printed wiring board 27 from being warped when the cooling mechanism 28 is pressed against it. Further, since the distance between one screw hole of the first fixing portion 31 and one screw hole of the second fixing portion 32 is set equal to that between the other screw hole of the first fixing portion 31 and the other screw hole of the second fixing portion 32, reinforcing plates 29 of the same size and shape can be attached to both the first and second areas 27A and 27B. As a result, the types of reinforcing plates 29 can be reduced to thereby reduce the manufacturing cost.

Further, the first fixing portion 31 formed of a pair of screw holes can be used in common when the reinforcing plate 29 is attached to the first area 27A and when it is attached to the second area 27B. In general, on printed circuit boards, a large number of circuit components are mounted at high density, and a large number of interconnects are provided at high density. Under these circumstances, the second embodiment, in which the number of required screw holes can be reduced to enhance the mounting density of the printed circuit board 42 and shorten the lengths of the interconnects, is very advantageous.

Figure 6:
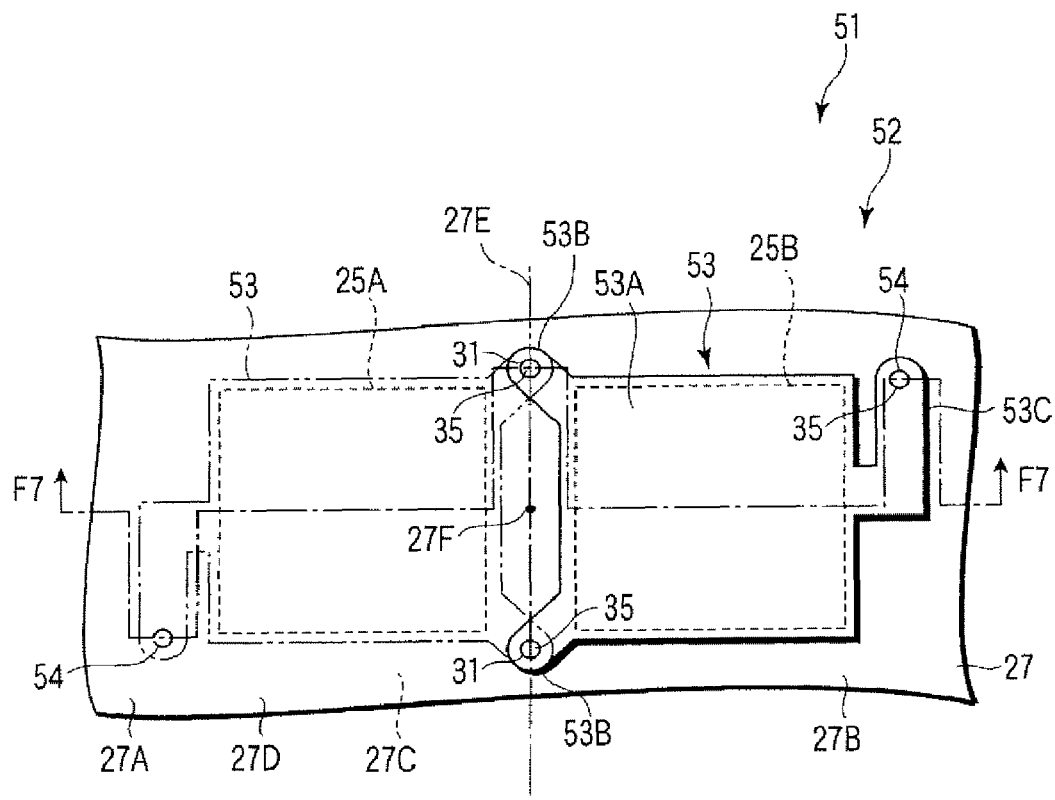
FIG. 6 is an exemplary upper view illustrating part of a printed circuit board incorporated in a portable computer according to a third embodiment.
Figure 7:
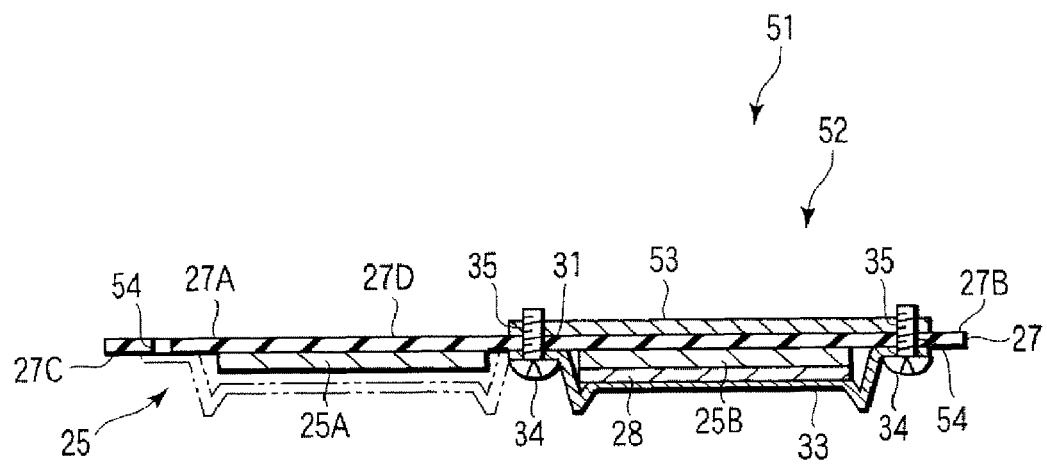
FIG. 7 is an exemplary sectional view taken along line F7-F7 in FIG. 6.

Referring then to FIGS. 6 and 7, an electronic apparatus according to a third embodiment will be described. A portable computer 51 as an example of the electronic apparatus according to the third embodiment differs from the first embodiment in a printed circuit board 52, and is similar thereto in the other portions. Therefore, in this embodiment, elements similar to those of the first embodiment are denoted by corresponding reference numbers, and a description will be mainly given of different portions.

The printed circuit board 52 according to the third embodiment comprises a printed wiring board 27 having a first area 27A and second area 27B adjacent thereto, circuit components 25 mounted on the first surface 27C of the printed wiring board 27, a cooling mechanism 28 for cooling the circuit components 25, a reinforcing plate 53 attached to the second surface 27D of the printed wiring board 27 in the area corresponding to one of the circuit components 25, and first fixing portion 31 and second fixing portion 54 provided at the printed wiring board 27 to fix the reinforcing plate 53 to the wiring board 27. The cooling mechanism 28 is formed of, for example, a heat-dissipating metal plate. The printed circuit board 52 has a plate spring 33 that presses the cooling mechanism 28 against the one circuit component 25. The plate spring 33 and reinforcing plate 53 are fixed to the printed wiring board 27 by screws 34.

The printed wiring board 27 has the first area 27A located on the left side in FIG. 6, and the second area 27B located adjacent thereto on the right side, and a border line 27E defining the first and second areas 27A and 27B.

The circuit components 25 are, for example, a north bridge 25A and graphics chip 25B. The north bridge 25A is fixed to the first area 27A of the printed wiring board 27, and the graphics chip 25B is fixed to the second area 27B of the printed wiring board 27.

The reinforcing plate 53 is attached to the second area 27B corresponding to the graphics chip 25B. The reinforcing plate 53 comprises a rectangular main body 53A, a pair of arm portions 53B obliquely extending from the main body 53A, and a hook portion 53C projecting from one side of the main body 53A. The hook portion 53C is bent at right angles. The pair of arm portions 53B and hook portion 53C have screw holes 35. The reinforcing plate 53 is screwed to the printed wiring board 27 by screws 34 inserted through the screw holes 35.

The first fixing portion 31 comprises a pair of elements provided at the printed wiring board 27 on the border line 27E thereof. Specifically, the first fixing portion 31 comprises a pair of screw holes in the printed wiring board 27 on the border line 27E. The printed wiring board 27 also has a center point 27F between the pair of elements, i.e., between the pair of screw holes. The second fixing portion 54 comprises a pair of elements arranged point symmetrical with respect to the center point 27F. Specifically, the second fixing portion 54 comprises a pair of screw holes formed in the printed wiring board 27 point symmetrical with respect to the center point 27F. In this structure, the heat generated by the graphics chip 25B is dissipated by the dissipation metal plate of the cooling mechanism 28.

As indicated by the two-dot chain lines in FIGS. 6 and 7, the reinforcing plate 53, cooling mechanism 28 and plate spring 33 may be provided on the first area 27A. In this case, the reinforcing plate indicated by the solid line is rotated through 180°.

In the third embodiment, the first fixing portion 31 includes a pair of elements provided on the border line 27E that defines the first and second areas 27A and 27B, and can attach the reinforcing plate 53 to any one of the first and second areas 27A and 27B. Further, the printed wiring board 27 has the center point 27F located between the pair of fixing portion 31. The second fixing portion 54 includes a pair of elements arranged point symmetrical with respect to the center point 27F. In this structure, the distance between the center point 27F and one screw hole of the second fixing portion 54 is set equal to the distance between the center point 27F and the other screw hole of the second fixing portion 54. Therefore, reinforcing plates 53 of the same size and shape can be attached to both the first and second areas 27A and 27B.

Further, the first fixing portion 31 formed of a pair of screw holes can be used in common between the time when the reinforcing plate 53 is attached to the first area 27A and the time when it is attached to the second area 27B. This can increase the mounting density of the printed circuit board 52, and the required length of each interconnect on the printed circuit board 52 can be shortened.

Figure 8:
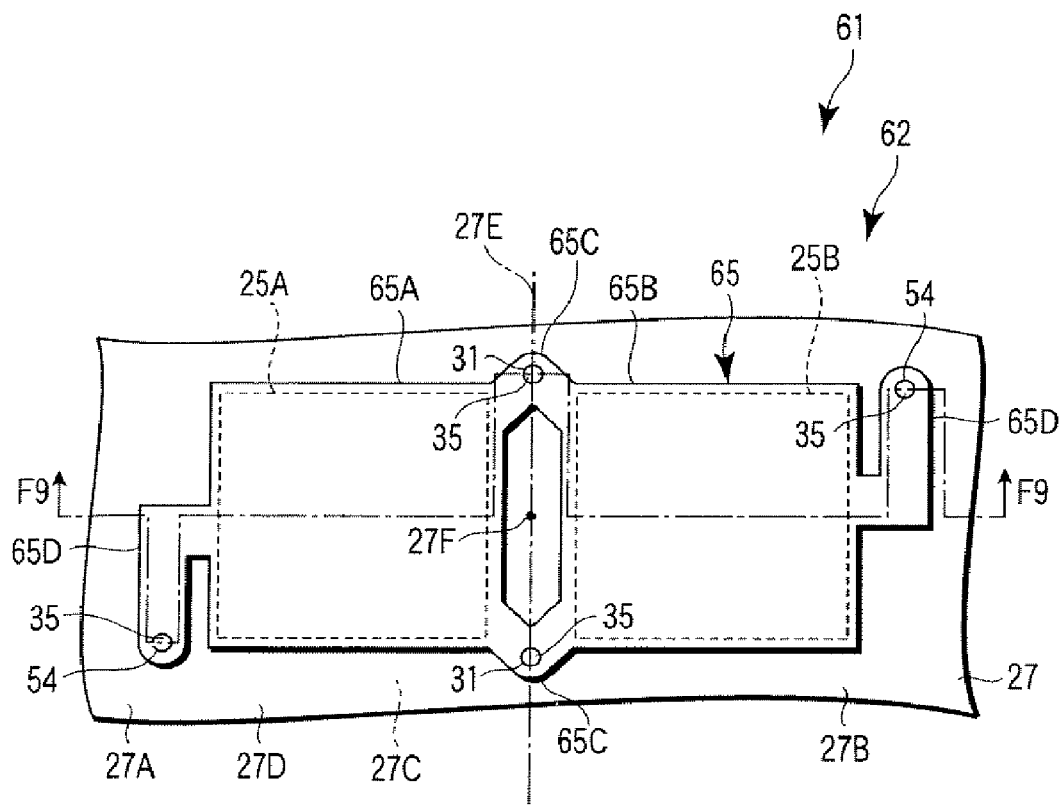
FIG. 8 is an exemplary upper view illustrating part of a printed circuit board incorporated in a portable computer according to a fourth embodiment.
Figure 9:
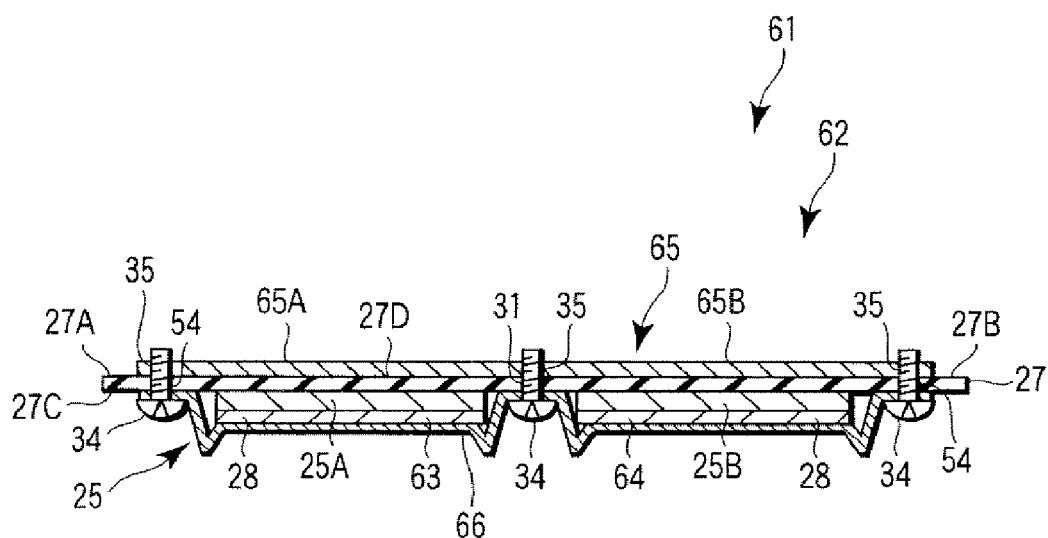
FIG. 9 is an exemplary sectional view taken along line F9-F9 in FIG. 8.

Referring then to FIGS. 8 and 9, an electronic apparatus according to a fourth embodiment will be described. A portable computer 61 as an example of the electronic apparatus according to the fourth embodiment differs from the first embodiment in a printed circuit board 62, and is similar thereto in the other portions. Therefore, in this embodiment, elements similar to those of the first embodiment are denoted by corresponding reference numbers, and a description will be mainly given of different portions.

The printed circuit board 62 according to the fourth embodiment comprises a printed wiring board 27 having a first area 27A and second area 27B adjacent thereto, circuit components 25 mounted on the first surface 27C of the printed wiring board 27, a cooling mechanism 28 for cooling the circuit components 25, a reinforcing plate 65 attached to the second surface 27D of the printed wiring board 27 in the area corresponding to the circuit components 25, and first fixing portion 31 and second fixing portion 54 provided at the printed wiring board 27 to fix the reinforcing plate 65 to the wiring board 27. The printed circuit board 62 has a plate spring 66 that presses the cooling mechanism 28 against the circuit components 25. The plate spring 66 is obtained by coupling two plate springs similar to the plate spring 33 employed in the first embodiment. The plate spring 66 and reinforcing plate 65 are fixed to the printed wiring board 62 by screws 34.

The printed wiring board 27 has the first area 27A located on the left side in FIG. 8, and the second area 27B located adjacent thereto on the right side, and a border line 27E defining the first and second areas 27A and 27B. The circuit components 25 are, for example, a north bridge 25A and graphics chip 25B. The north bridge 25A is fixed to the first area 27A of the printed wiring board 27, and the graphics chip 25B is fixed to the second area 27B of the printed wiring board 27. The cooling mechanism 28 is formed of a first heat-dissipating metal plate 63 attached to the north bridge 25A, and a second heat-dissipating metal plate 64 attached to the graphics chip 25B.

The reinforcing plate 65 is obtained by coupling two reinforcing plates similar to the reinforcing plate 53 of the third embodiment. The reinforcing plate 65 is a so-called electrolytic zinc-coated steel sheet. The reinforcing plate 65 comprises first and second rectangular portions 65A and 65B, a pair of arm portions 65C coupling the first and second portions 65A and 65B, and hook portions 65D projecting from the first and second portions 65A and 65B. The first portion 65A is positioned in the first area 27A corresponding to the north bridge 25A. The second portion 65B is positioned in the second area 27B corresponding to the graphics chip 25B. The pair of arm portions 65C and hook portions 65D have screw holes 35. The reinforcing plate 65 is screwed to the printed wiring board 27 by screws 34 inserted through the screw holes 35.

The first fixing portion 31 comprises a pair of elements provided at the printed wiring board 27 on the border line 27E thereof. Specifically, the first fixing portion 31 comprises a pair of screw holes in the printed wiring board 27 on the border line 27E. The printed wiring board 27 also has a center point 27F between the pair of elements, i.e., the pair of screw holes. The second fixing portion 32 comprises a pair of elements arranged point symmetrical with respect to the center point 27F. Specifically, the second fixing portion 32 comprises a pair of screw holes formed in the printed wiring board 27 point symmetrical with respect to the center point 27F. In this structure, the heat generated by the north bridge 25A is dissipated by the first dissipation metal plate 63 of the cooling mechanism 28, and the heat generated by the graphics chip 25B is dissipated by the second dissipation metal plate 64 of the cooling mechanism 28.

In the fourth embodiment, when both the north bridge 25A and graphics chip 25B should be cooled, both the first and second areas 27A and 27B can be reinforced by the reinforcing plate 65.

Figure 10:
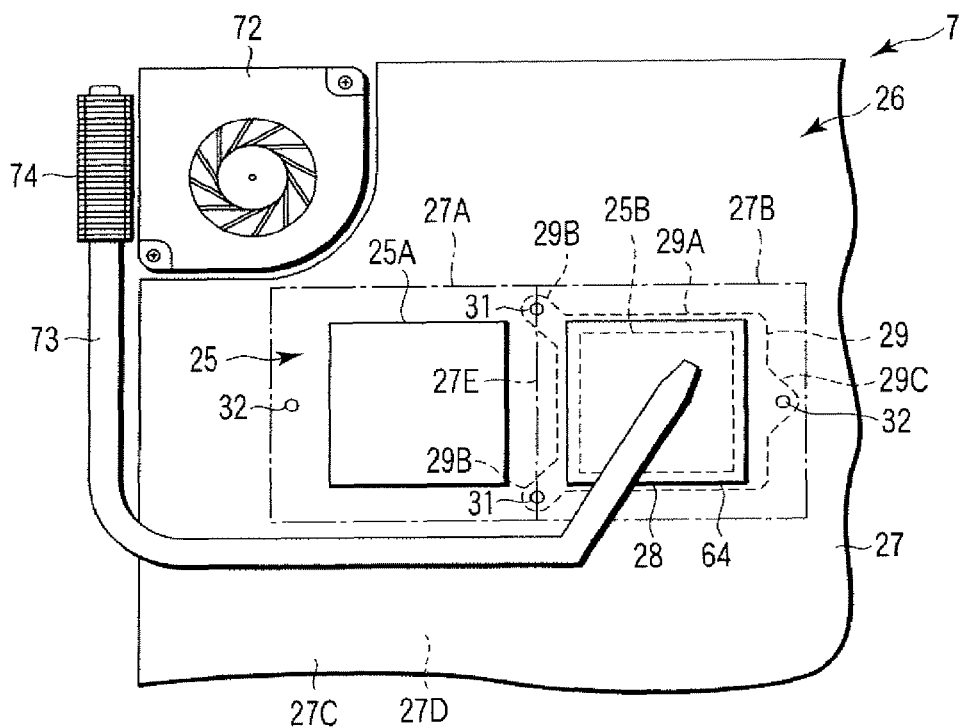
FIG. 10 is an exemplary upper view illustrating the interior of the housing of a portable computer according to a fifth embodiment.

Referring to FIG. 10, an electronic apparatus according to a fifth embodiment will be described. A portable computer 71 as an example of the electronic apparatus according to the fifth embodiment differs from the fourth embodiment in that the former incorporates a fan unit 72 and heat pipe 73, and is similar to the latter in the other portions. Therefore, in this embodiment, elements similar to those of the first embodiment are denoted by corresponding reference numbers, and a description will be mainly given of different portions.

The portable computer 71 incorporates, in a housing 21, a printed circuit board 26 with circuit components 25 mounted thereon.

The printed circuit board 26 comprises a printed wiring board 27 having a first area 27A and second area 27B adjacent thereto, circuit components 25 mounted on the first surface 27C of the printed wiring board 27, a cooling mechanism 28 for cooling the circuit components 25, a reinforcing plate 29 attached to the second surface 27D of the printed wiring board 27 in the area corresponding to one of the circuit components 25, and first and second fixing portion 31 and 32 provided at the printed wiring board 27 to fix the reinforcing plate 29 to the wiring board 27. The printed circuit board 26 further comprises a plate spring that presses the cooling mechanism 28 against the circuit components 25. The reinforcing plate 29 is screwed to the printed wiring board 27 by screws (not shown). Although FIG. 10 shows no plate spring and no screws, this embodiment employs the same plate spring structure as the first embodiment.

The printed wiring board 27 has the first area 27A located on the left side in FIG. 10, the second area 27B located adjacent thereto on the right side, and a border line 27E defining the first and second areas 27A and 27B. The circuit components 25 are, for example, a north bridge 25A and graphics chip 25B. The north bridge 25A is fixed to the first area 27A of the printed wiring board 27, and the graphics chip 25B is fixed to the second area 27B of the printed wiring board 27.

The cooling mechanism 28 has a second heat-dissipating metal plate 64 attached to the graphics chip 25B.

The reinforcing plate 29 has the same shape as that employed in the first embodiment, and is fixed to the second area 27B. The first fixing portion 31 comprises a pair of elements provided at the printed wiring board 27 on the border line 27E thereof. Specifically, the first fixing portion 31 comprises a pair of screw holes in the printed wiring board 27 on the border line 27E. Similarly, the second fixing portion 32 comprises a pair of elements provided at the printed wiring board 27 symmetrical with respect to the border line 27E. Specifically, the second fixing portion 32 comprises a pair of symmetrical screw holes in the printed wiring board 27.

The main unit 12 of the fifth embodiment further comprises a fan unit 72 for accelerating the cooling operation of the cooling mechanism 28, a heat pipe 73 for transmitting the heat of the cooling mechanism 28 to the fan unit 72, and a heat sink 74 for accelerating the cooling operation of the heat pipe 73. The heat sink 74 comprises a plurality of fins. One end of the heat pipe 73 is connected to the heat sink 74, and the other end is connected to the cooling mechanism 28 secured to the graphics chip 25B.

The heat pipe 73 is a cylindrical copper pipe and contains a liquid. The heat pipe 73 transmits the heat of the graphics chip 25B to the heat sink 74 located near the fan unit 72. The heat pipe 73 is located so that it does not overlap the first or second fixing portion 31 or 32 in position. The heat generated by the graphics chip 25B is transmitted to the heat sink 74 via the second heat-dissipating metal plate 64 of the cooling mechanism 28 and heat pipe 73. The heat of the heat sink 74 is exhausted to the outside of the housing 21 through the opening thereof by the air blown through the fan unit 72.

In the portable computer 71 of the fifth embodiment, the first and second fixing portion 31 and 32 do not overlap the heat pipe 73. With this structure, interference between the first and second fixing portion 31 and 32 and the heat pipe 73 can be avoided. Therefore, when, for example, the reinforcing plate 29 is detached from the printed circuit board 26, the heat pipe 73 does not hinder the detachment.

Figure 11:
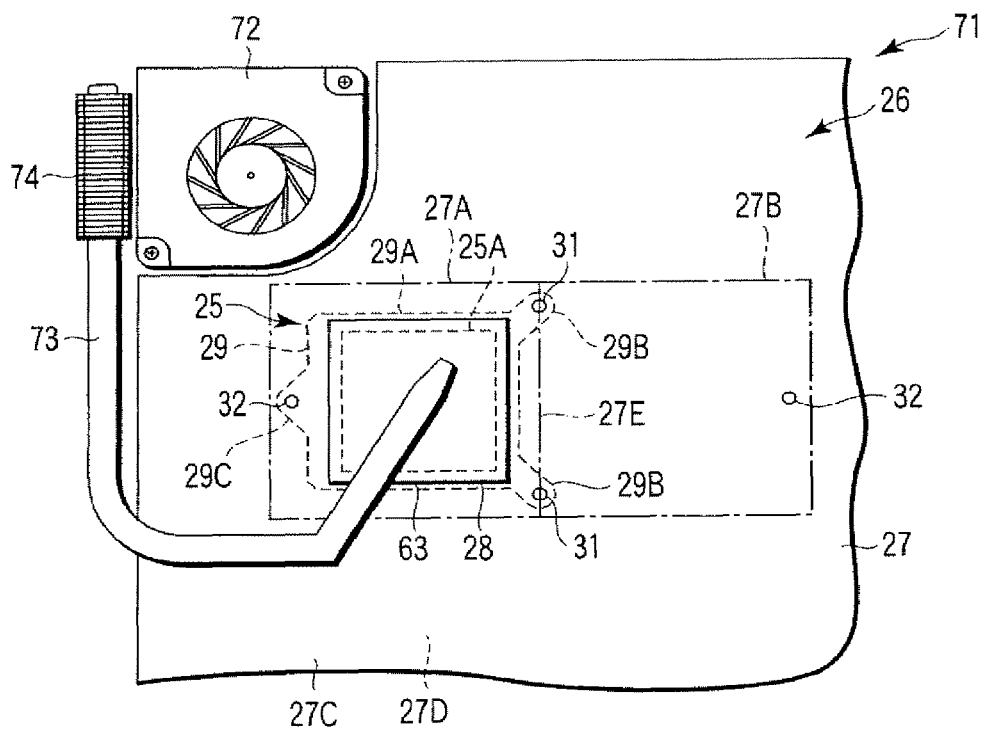
FIG. 11 is an exemplary upper view illustrating a modification of the portable computer according to the fifth embodiment.

FIG. 11 shows a modification of the fifth embodiment. In this modification, a circuit component 25 that comprises a north bridge 25A containing a graphics chip is provided. The reinforcing plate 29 employed therein has the same shape as that of the first embodiment, and is attached to the first area 27A. The other end of the heat pipe 73 is connected to the cooling mechanism 28 secured to the north bridge 25A. The heat generated by the north bridge 25A is transmitted to the heat sink 74 via the first heat-dissipating metal plate 63 of the cooling mechanism 28, and the heat pipe 73. In the fifth embodiment and its modification, the reinforcing plate 29 can be attached to any one of the first and second areas 27A and 27B. Further, since the first and second fixing portion 31 and 32 do not overlap the heat pipe 73 in position, the heat pipe 73 does not hinder the detachment when, for example, the reinforcing plate 29 is detached from the printed circuit board 26.

Referring then to FIG. 12, an electronic apparatus according to a sixth embodiment will be described. A portable computer 81 as an example of the electronic apparatus according to the sixth embodiment differs from the fifth embodiment in that the former incorporates a fan unit 72 and heat pipe 73, and is similar to the latter in the other portions. Therefore, in this embodiment, elements similar to those of the first embodiment are denoted by corresponding reference numbers, and a description will be mainly given of different portions.

The portable computer 81 of the sixth embodiment incorporates, in a housing 21, a printed circuit board 82 with circuit components 25 mounted thereon.

The printed circuit board 82 comprises a printed wiring board 27 having a first area 27A and second area 27B adjacent thereto, circuit components 25 mounted on the first surface 27C of the printed wiring board 27, a cooling mechanism 28 for cooling the circuit component 25, a reinforcing plate 53 attached to the second surface 27D of the printed wiring board 27 in the area corresponding to one of the circuit components 25, and first and second fixing portion 31 and 83 provided at the printed wiring board 27 to fix the reinforcing plate 53 to the wiring board 27. The printed circuit board 82 further comprises a plate spring that presses the cooling mechanism 28 against the one circuit component 25. The reinforcing plate 53 is screwed to the printed wiring board 27 by screws. Although FIG. 12 shows no plate spring and no screws, this embodiment employs the same plate spring and screw structures as the first embodiment.

The printed wiring board 27 has the first area 27A located on the left side in FIG. 12, the second area 27B located adjacent thereto on the right side, and a border line 27E defining the first and second areas 27A and 27B. The circuit components 25 are, for example, a north bridge 25A and graphics chip 25B. The north bridge 25A is fixed to the first area 27A of the printed wiring board 27, and the graphics chip 25B is fixed to the second area 27B of the printed wiring board 27. The cooling mechanism 28 has a second heat-dissipating metal plate 64 attached to the graphics chip 25B.

The reinforcing plate 53 has the same shape as that employed in the third embodiment. The first fixing portion 31 comprises a pair of elements provided at the printed wiring board 27 on the border line 27E thereof. Specifically, the first fixing portion 31 comprises a pair of screw holes in the printed wiring board 27 on the border line 27E. The printed wiring board 27 also has a center point 27F between the pair of elements, i.e., the pair of screw holes. The second fixing portion 83 comprises a pair of elements arranged point symmetrical with respect to the center point 27F. Specifically, the second fixing portion 83 comprises a pair of screw holes formed in the printed wiring board 27 point symmetrical with respect to the center point 27F.

The main unit 12 of the sixth embodiment further comprises a fan unit 72 for accelerating the cooling operation of the cooling mechanism 28, a heat pipe 73 for transmitting the heat of the cooling mechanism 28 to the fan unit 72, and a heat sink 74 for accelerating the cooling operation of the heat pipe 73. The heat sink 74 comprises a plurality of fins. One end of the heat pipe 73 is connected to the heat sink 74, and the other end is connected to the cooling mechanism 28 secured to the graphics chip 25B.

The heat pipe 73 transmits the heat of the graphics chip 25B to the heat sink 74 located near the fan unit 72. The heat pipe 73 is located so that it does not overlap the first or second fixing portion 31 or 83 in position. The heat generated by the graphics chip 25B is transmitted to the heat sink 74 via the second heat-dissipating metal plate 64 of the cooling mechanism 28 and heat pipe 73. The heat of the heat sink 74 is exhausted to the outside of the housing 21 through the opening thereof by the air blown through the fan unit 72.

In the sixth embodiment, the distance between the center point 27F and one screw hole of the second fixing portion 83 is set equal to the distance between the center point 27F and the other screw hole of the second fixing portion 83. Therefore, reinforcing plates 53 of the same size and shape can be attached to both the first and second areas 27A and 27B. Further, the first fixing portion 31 formed of a pair of screw holes can be used in common when the reinforcing plate 29 is attached to the first area 27A and when it is attached to the second area 27B.

Furthermore, the first and second fixing portion 31 and 83 do not overlap the heat pipe 73 in position. With this structure, interference between the first and second fixing portion 31 and 83 and the heat pipe 73 can be avoided. Therefore, when, for example, the reinforcing plate 53 is detached from the printed circuit board 82, the heat pipe 73 does not hinder the detachment.

FIG. 13 shows a modification of the sixth embodiment. In this modification, a circuit component 25 that comprises a north bridge 25A containing a graphics chip is provided. The reinforcing plate 53 employed therein has the same shape as that of the third embodiment, and is attached to the first area 27A. The other end of the heat pipe 73 is connected to the cooling mechanism 28 secured to the north bridge 25A.

In the sixth embodiment and its modification, the reinforcing plate 29 can be attached to any one of the first and second areas 27A and 27B. Further, since the first and second fixing portion 31 and 83 do not overlap the heat pipe 73 in position, the heat pipe 73 does not hinder the detachment when, for example, the reinforcing plate 53 is detached from the printed circuit board 82.

Referring last to FIG. 14, an electronic apparatus according to a seventh embodiment will be described. This embodiment employs the same reinforcing plate 65 as the fourth embodiment of FIG. 8. One end of the heat pipe 73 is connected to the heat sink 74, and the other end is connected to the part of the cooling mechanism 28 secured to the graphics chip 25B. The middle portion of the heat pipe 73 is connected to the part of the cooling mechanism 28 secured to the north bridge 25A. In the seventh embodiment, the heat generated by the north bride 25A and graphics chip 25B is transmitted to the heat sink 74 via the heat-dissipating plates 63 and 64 of the cooling mechanism 28 and the heat pipe 73.

In the seventh embodiment, when both the north bride 25A and graphics chip 25B are cooled by the heat pipe 73, the heat pipe 73 does not interfere with the first and second fixing portion 31 and 83.

The printed circuit boards and electronic apparatuses according to the above-described embodiments are not limited to portable computers, but also applicable to other type of electronic apparatuses such as cellular phones. Further, the printed circuit boards and electronic apparatuses can be modified in various ways without departing from the scope of the invention. Further, in each of the embodiments, although the first fixing portion 31 comprises a pair of screw holes in the printed wiring board 27 on the border line 27E, it is not limited to them, but may be a single screw hole arranged on the border line 27E.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A printed circuit board comprising:
    a printed wiring board including a first surface and a second surface, the second surface located on a side of the printed wiring board opposite from the first surface, the second surface includes a first area and a second area being on the opposite side of the printed wiring board from a first area and a second area of the first surface;
    a first circuit component fixed to the first area of the first surface;
    a reinforcing plate secured to at least the first area of the second surface of the printed wiring board, the reinforcing plate is sized to cover at least a portion of the first area of the second surface of the printed wiring board that is opposite from and corresponds to a portion of the first area of the first surface of the printed wiring board occupied by the first circuit component while the second area of the second surface of the printed wiring board remains uncovered by the reinforcing plate; and
    a fixing member provided by the printed wiring board to secure the reinforcing plate to the printed wiring board, the fixing member is provided in an area of the printed wiring board other than the first area of the second surface of the printed wiring board.

2. The printed circuit board according to claim 1, wherein the fixing member includes a plurality of screw holes each adapted for receipt of a screw.

3. An electronic apparatus comprising:
    a housing; and a printed circuit board contained in the housing, the printed circuit board includes:
  a printed wiring board including a first surface and a second surface, the second surface located on a side of the printed wiring board opposite from the first surface;
  a first circuit component fixed to a first area of the first surface;
  a second circuit component fixed to a second area of the first surface;
  a reinforcing plate secured to the first area and the second area of the second surface of the printed wiring board, the reinforcing plate is sized to cover at least a portion of a first area of the second surface corresponding to a portion of the first area of the first surface the printed wiring board occupied by the first circuit component while the second area of the second surface of the printed wiring board remains uncovered by the reinforcing plate; and
  a fixing member provided at the printed wiring board to secure the reinforcing plate to the printed wiring board, the fixing member is provided between the first area and a second area of the second surface being in a different location than the first area.

4. An electronic apparatus comprising:
a housing; and
a printed circuit board contained in the housing, the printed circuit board includes:
  a printed wiring board including a first surface and a second surface, the second surface located on a side of the printed wiring board opposite from the first surface;
  a first circuit component fixed to a first area of the first surface,
  a second circuit component fixed to a second area of the first surface,
  a reinforcing plate secured to the first area and the second area of the second surface of the printed wiring board, the reinforcing plate is sized to cover a first area of the second surface that is opposite from a portion of the first area of the first surface occupied by at least an edge of the first circuit component, and
  a fixing member provided at the printed wiring board to secure the reinforcing plate to the printed wiring board, the fixing member is provided between the first area and a second area of the second surface being in a different location than the first area,
  a fan unit which cools the first circuit component and the second circuit component,
  a heat pipe which transmits, to the fan unit, heat generated by the first circuit component and the second circuit component, and
  a plurality of screws each inserted through a corresponding one of a plurality of apertures of the fixing member;
  wherein the plurality of apertures are apart from the heat pipe in position.

5. The electronic apparatus according to claim 3, wherein the fixing member comprises a plurality of apertures being screw holes each adapted for receipt of a screw.

6. An electronic apparatus comprising:
a housing; and
a printed circuit board contained in the housing, the printed circuit board includes:
  a printed wiring board including a first surface, and a second surface;
  a first circuit component fixed to a first area of the first surface;
  a second circuit component fixed to a second area of the first surface;
  a reinforcing plate secured to the first area and the second area of the second surface of the printed wiring board, the reinforcing plate is sized to cover (i) at least a portion of a first area of the second surface of the printed wiring board that is opposite from a portion of the first area of the first surface occupied by at least one edge of the first circuit component and corresponds to the portion of the first area of the first surface of the printed wiring board occupied by the first circuit component, and (ii) a second area of the second surface of the printed wiring board that is opposite from a portion of a second area of the first surface of the printed wiring board occupied by at least one edge of the second circuit component remains uncovered by the reinforcement plate; and
  a fixing member provided by the printed wiring board to secure the reinforcing plate to the printed wiring board, the fixing member is provided between the first area and the second area.

7. The electronic apparatus according to claim 6, further comprising
  a fan unit which cools at least the first component circuit; and
  a heat pipe which transmits, to the fan unit, heat generated by at least the first circuit component.

8. The electronic apparatus according to claim 7, wherein the fixing member comprises a plurality of screw holes adapted for receipt of corresponding fastening members being two screws.

9. A printed circuit board comprising:
  a printed wiring board including a first area and a second area;
  a first circuit component fixed to the first area;
  a second circuit component fixed to the second area;
  a reinforcing plate secured to the first area and the second area, the reinforcing plate is sized to cover (i) at least a portion of a third area on a side of the printed wiring board that corresponds to a portion of the first area of a first surface of the printed wiring board occupied by the first circuit component and (ii) a fourth area on the side of the printed wiring board that is opposite from a portion of the second area occupied by at least one edge of the second circuit component remains uncovered by the reinforcing plate; and
  a fixing member provided by the printed wiring board to secure the reinforcing plate to the printed wiring board, the fixing member is provided between the first area and the second area.

10. The printed circuit board according to claim 9, wherein the first circuit component is fixed to the first area of the first surface of the printed wiring board, the second circuit component is fixed to the second area of the first surface of the printed wiring board, and the reinforcing plate is secured to the third area and the fourth area of a second surface of the printed wiring board, the second surface of the printed wiring board being the side of the printed wiring board opposite the first surface.

11. The printed circuit board according to claim 10, wherein the fixing member includes at least one screw hole adapted for receipt of and securing a screw.

12. The printed circuit board according to claim 10, wherein the reinforcing plate includes a first reinforcing plate sized larger than a periphery of the first circuit component, a second reinforcing plate sized larger than a periphery of the second circuit component and at least one arm portion coupling the first reinforcing plate to the second reinforcing plate.

13. The printed circuit board according to claim 9, wherein the second circuit component being a processor with graphics functionality.

14. The printed circuit board according to claim 1, wherein the first circuit component being a processor with graphics functionality.

15. The electronic apparatus according to claim 3, wherein the first circuit component of the printed wiring board being a part of a chipset and the second circuit component of the printed wiring board being a processor with graphics functionality.

16. The electronic apparatus according to claim 3, wherein the reinforcing plate of the printed wiring board of the printed circuit board includes a first reinforcing plate sized larger than a periphery of the first circuit component, a second reinforcing plate sized larger than a periphery of the second circuit component and at least one arm portion coupling the first reinforcing plate to the second reinforcing plate.

17. The electronic apparatus according to claim 6, wherein the first circuit component of the printed wiring board being a part of a chipset.

18. The electronic apparatus according to claim 6, wherein the second circuit component of the printed wiring board being a processor with graphics functionality.

19. The electronic apparatus according to claim 6, wherein the reinforcing plate of the printed wiring board of the printed circuit board includes a first reinforcing plate sized larger than a periphery of the first circuit component, a second reinforcing plate sized larger than a periphery of the second circuit component and at least one arm portion coupling the first reinforcing plate to the second reinforcing plate.

20. The printed circuit board of claim 1, wherein the reinforcing plate is sized to cover the portion of the first area of the second surface of the printed wiring board that is opposite from the portion of the first area of the first surface of the printed wiring board occupied by at least two edges the first circuit component.

21. The electronic apparatus of claim 3, wherein the reinforcing plate is sized to cover the portion of the first area of the second surface of the printed wiring board that is opposite from the portion of the first area of the first surface of the printed wiring board occupied by at least two edges of the first circuit component.

22. The electronic apparatus of claim 6, wherein the reinforcing plate is sized to cover (i) the portion of the first area of the second surface of the printed wiring board this is opposite from the portion of the first area of the first surface of the printed wiring board occupied by at least two edges of the first circuit component and (ii) the second area on the second surface of the printed wiring board that is opposite from the portion of the second area on the first surface occupied by at least two edges of the second circuit component.

23. The printed circuit board of claim 9, wherein the reinforcing plate is sized to cover (i) the third area on the side of the printed wiring board this is opposite from the portion of the first area occupied by at least two edges of the first circuit component and (ii) the fourth area on the side of the printed wiring board that is opposite from the portion of the second area occupied by at least two edges of the second circuit component.

24. The printed circuit board according to claim 1, wherein the reinforcement plate includes a main body and at least one arm portion being narrower than the main body and extending from the main body, the fixing member is situated outside an area occupied by the main body of the reinforcing plate.

25. The printed circuit board according to claim 1, wherein the reinforcing plate is sized to leave the second area of the second surface uncovered, the second area of the second surface corresponding to an area of the first surface of the printed wiring board on which a second circuit component is mounted.

* * * * *